United States Patent [19]
Waller

[11] Patent Number: 6,104,661
[45] Date of Patent: *Aug. 15, 2000

[54] SEMICONDUCTOR MEMORY WITH LOCAL PHASE GENERATION FROM GLOBAL PHASE SIGNALS AND LOCAL ISOLATION SIGNALS

[75] Inventor: William K. Waller, Rockwall, Tex.

[73] Assignee: Micron Technology, Inc., Boise, Id.

[*] Notice: This patent is subject to a terminal disclaimer.

[21] Appl. No.: 09/416,711

[22] Filed: Oct. 12, 1999

Related U.S. Application Data

[63] Continuation of application No. 09/083,606, May 22, 1998.
[51] Int. Cl.[7] ...................................................... G11C 8/00
[52] U.S. Cl. ................................ 365/230.01; 365/230.04
[58] Field of Search ......................... 365/230.01, 230.03, 365/230.06, 230.04

[56] References Cited

U.S. PATENT DOCUMENTS

| | | | |
|---|---|---|---|
| 5,726,596 | 3/1998 | Perez | 327/292 |
| 5,774,412 | 6/1998 | Raad et al. | 365/230.06 |
| 5,898,636 | 4/1999 | Keeth | 365/230.06 |

*Primary Examiner*—David Nelms
*Assistant Examiner*—David Lam
*Attorney, Agent, or Firm*—Trask Britt

[57] ABSTRACT

A Dynamic Random Access Memory (DRAM) eliminates the need to route section signals to local phase drivers to generate local phase signals by gating local isolation signals and global phase signals together in the local phase drivers to generate the local phase signals. As a result, the die "footprint" of the DRAM is reduced.

6 Claims, 5 Drawing Sheets

6,104,661

SEMICONDUCTOR MEMORY WITH LOCAL PHASE GENERATION FROM GLOBAL PHASE SIGNALS AND LOCAL ISOLATION SIGNALS

CROSS REFERENCE TO RELATED APPLICATION

This application is a continuation of application Ser. No. 09/083,606, filed May 22, 1998, pending.

BACKGROUND OF THE INVENTION

1. Field of the Invention

This invention relates in general to semiconductor memories and, more specifically, to semiconductor memories in which local phase signals are generated in local phase drivers using global phase signals and local isolation signals, thus eliminating the need to route section signals to the local phase drivers.

2. State of the Art

As shown in FIG. 1, a conventional Dynamic Random Access Memory (DRAM) 10 includes multiple 256 Kilobit (KB) sub-arrays 12 accessed using even and odd row decoders 14 and 16, sense amplifiers 18, gap circuitry 20, center circuitry 22, and address circuitry 24. More specifically, accessing one of the sub-arrays 12 begins when the address circuitry 24 receives a memory address (not shown) and outputs section signals SECTION, global isolation signals GISO, and global phase signals GPH in response. Referring to FIG. 2 for a moment, the center circuitry 22 receives the section signals SECTION and the global isolation signals GISO and gates them together in local isolation (LISO) circuitry 26 to produce local isolation signals LISO. Referring now to FIG. 3, the gap circuitry 20 receives the section signals SECTION and the global phase signals GPH and gates them together in local phase drivers 28 to produce local phase signals LPH. The local phase signals LPH are then used in conjunction with the memory address (not shown) by one of the row decoders 14 and 16 to fire a selected row in one of the sub-arrays 12. Once the selected row is fired, the local isolation signals LISO are used in one of the sense amplifiers 18 in conjunction with the memory address (not shown) to access a selected column in the same sub-array 12 as the selected row.

As can be seen in FIG. 1, many signals must be routed to the gap circuitry 20 and sense amplifiers 18, including the section signals SECTION, the local isolation signals LISO, and the global phase signals GPH. These signals use "real estate" on the die on which the DRAM 10 is fabricated, and thus limit the functional circuitry that can be implemented in the DRAM 10, or increase the necessary size of the die on which the DRAM 10 is fabricated. Thus, it would be desirable to reduce the signals routed to the gap circuitry 20 and sense amplifiers 18 in order to increase the functional circuitry that can be implemented in the DRAM 10 or decrease the necessary size of the die on which the DRAM 10 is fabricated.

Therefore, there is a need in the art for a semiconductor memory having a reduced number of signals routed to gap circuitry and sense amplifiers.

SUMMARY OF THE INVENTION

A semiconductor memory, such as a Dynamic Random Access Memory (DRAM), in accordance with the invention includes address circuitry for receiving memory addresses and outputting corresponding section signals, global isolation signals, and global phase signals. Local isolation circuitry incorporated, for example, into center circuitry of the semiconductor memory outputs local isolation signals in accordance with the section signals and the global isolation signals. Local phase signal circuitry, such as local phase drivers, outputs local phase signals in accordance with the global phase signals and the local isolation signals. Row accessing circuitry, such as row decoders, activates rows in a memory array of the semiconductor memory that are selected in accordance with the memory addresses and the local phase signals. Column accessing circuitry, such as sense amplifiers, accesses columns in the memory array selected in accordance with the memory addresses using the local isolation signals.

Thus, the local phase signal circuitry uses the local isolation signals in combination with the global phase signals to generate the local phase signals, in contrast to the conventional practice previously described, in which local phase drivers use section signals in combination with the global phase signals to generate the local phase signals. By eliminating the use of the section signals to generate the local phase signals, the invention eliminates the need to route the section signals to the local phase drivers, and thus reduces the die "footprint" of the semiconductor memory.

In other embodiments of the invention, the above described semiconductor memory is incorporated into an electronic system and is fabricated on the surface of a semiconductor substrate, such as a semiconductor wafer.

In still another embodiment of the invention—a method of accessing a memory array in a semiconductor memory—memory addresses are provided to the semiconductor memory, and section signals, global isolation signals, and global phase signals are then generated in accordance with the memory addresses. The section signals and global isolation signals are gated together to generate local isolation signals, and the local isolation signals and global phase signals are then gated together to generate local phase signals. With the local phase signals generated, rows in the memory array selected in accordance with the memory addresses and the local phase signals are activated, and columns in the memory array selected in accordance with the memory addresses are accessed using the local isolation signals.

DETAILED DESCRIPTION OF THE INVENTION

Figure 4:
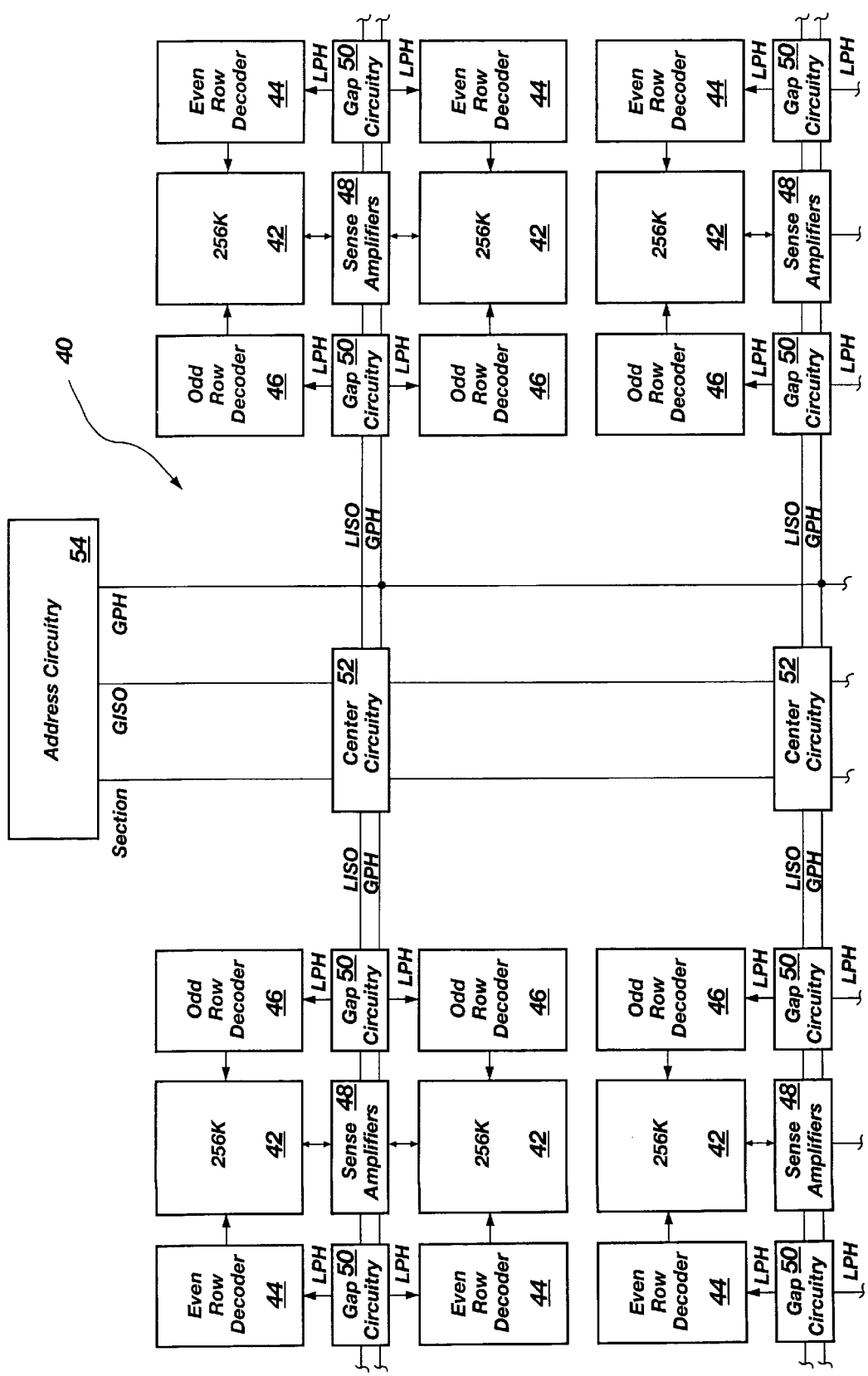
FIG. 4 is a block diagram of a DRAM in accordance with the present invention in which local isolation signals and global phase signals are used to generate local phase signals.

As shown in FIG. 4, a Dynamic Random Access Memory (DRAM) 40 in accordance with this invention includes multiple 256 Kilobit (KB) sub-arrays 42 accessed using even and odd row decoders 44 and 46, sense amplifiers 48, gap circuitry 50, center circuitry 52, and address circuitry 54. Although this invention will be described with reference to the DRAM 40, it will be understood by those having skill in the technical field of this invention that it is applicable not only to DRAMs, but also to a wide variety of other semiconductor memories. Also, it will be understood that this invention may be implemented using a wide variety of semiconductor memory architectures other than that shown in FIG. 4, and that the scope of the present invention is limited only by the claims.

Figure 5:
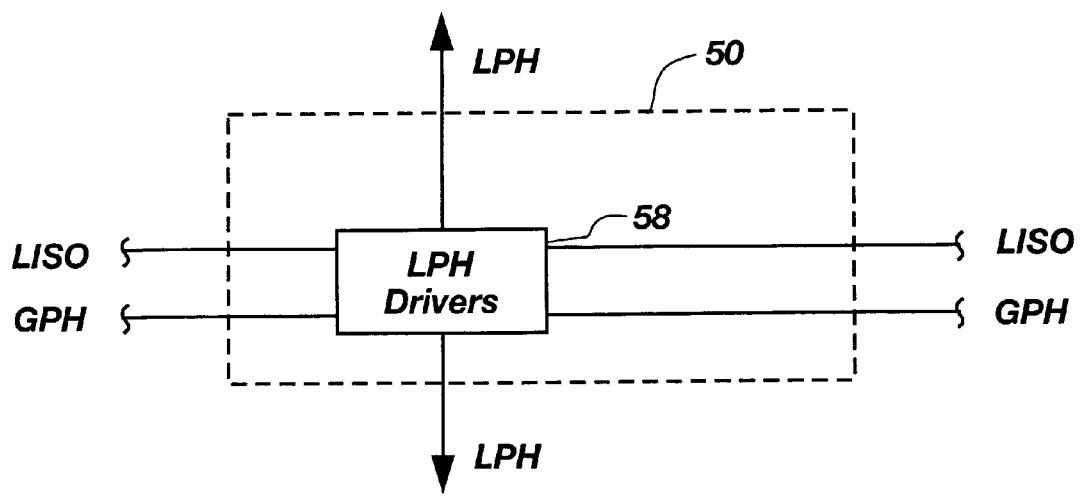
FIG. 5 is a more detailed view of the sense amplifier gap circuitry of FIG. 4.

Accessing one of the sub-arrays 42 begins when the address circuitry 54 receives a memory address (not shown) and outputs section signals SECTION, global isolation signals GISO, and global phase signals GPH in response. The center circuitry 52 receives the section signals SECTION and the global isolation signals GISO and gates them together to produce local isolation signals LISO. Referring for a moment to FIG. 5, the gap circuitry 50 receives the local isolation signals LISO and the global phase signals GPH and gates them together in local phase drivers 58 to produce local phase signals LPH. Referring again to FIG. 4, the local phase signals LPH are then used in conjunction with the memory address (not shown) by one of the row decoders 44 and 46 to fire a selected row in one of the sub-arrays 42. Once the selected row is fired, the local isolation signals LISO are used in one of the sense amplifiers 48 in conjunction with the memory address (not shown) to access a selected column in the same sub-array 42 as the selected row.

Figure 1:
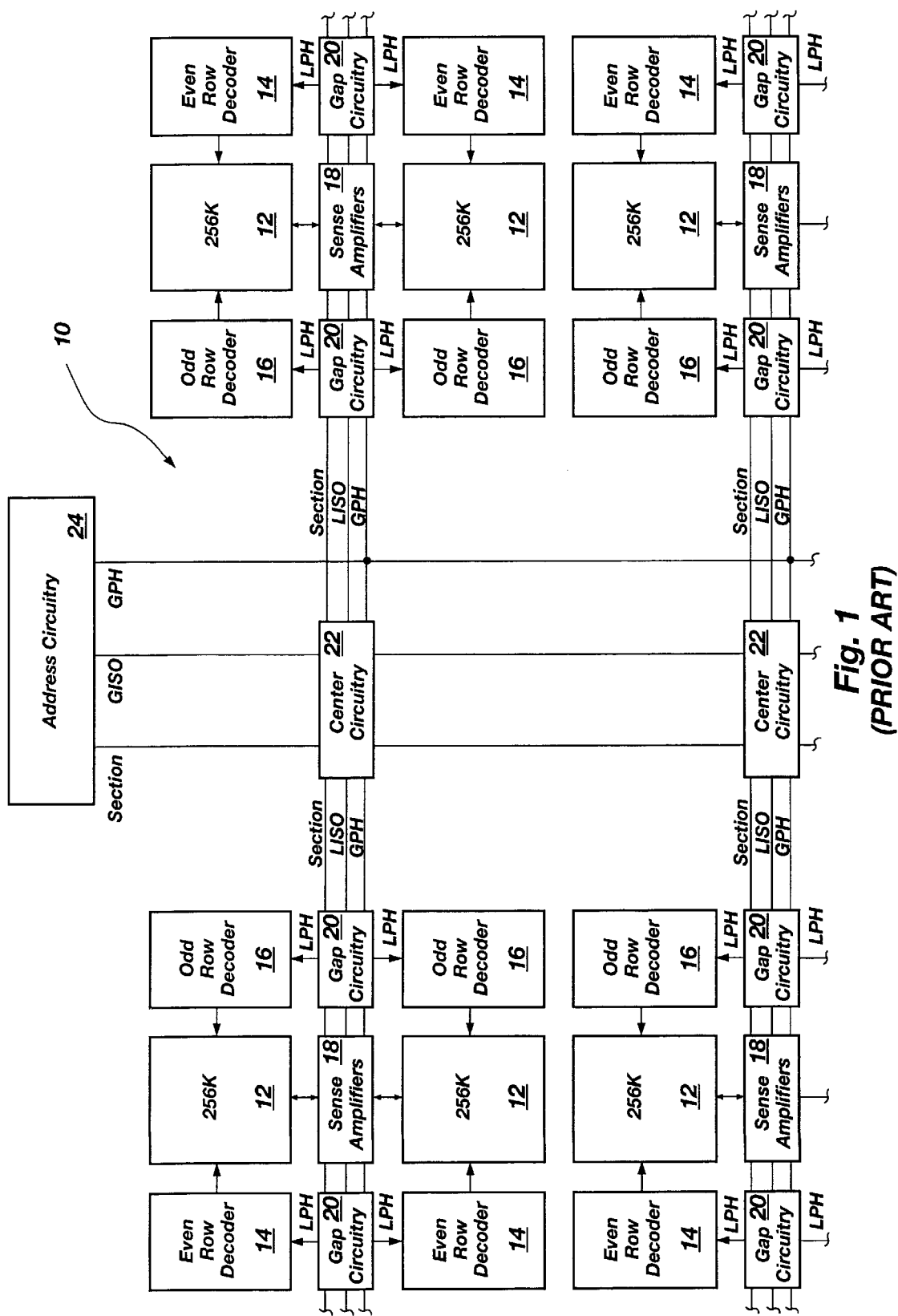
FIG. 1 is a block diagram of a conventional Dynamic Random Access Memory (DRAM) in which section signals are routed to local phase drivers in sense amplifier gap circuitry to generate local phase signals.
Figure 2:
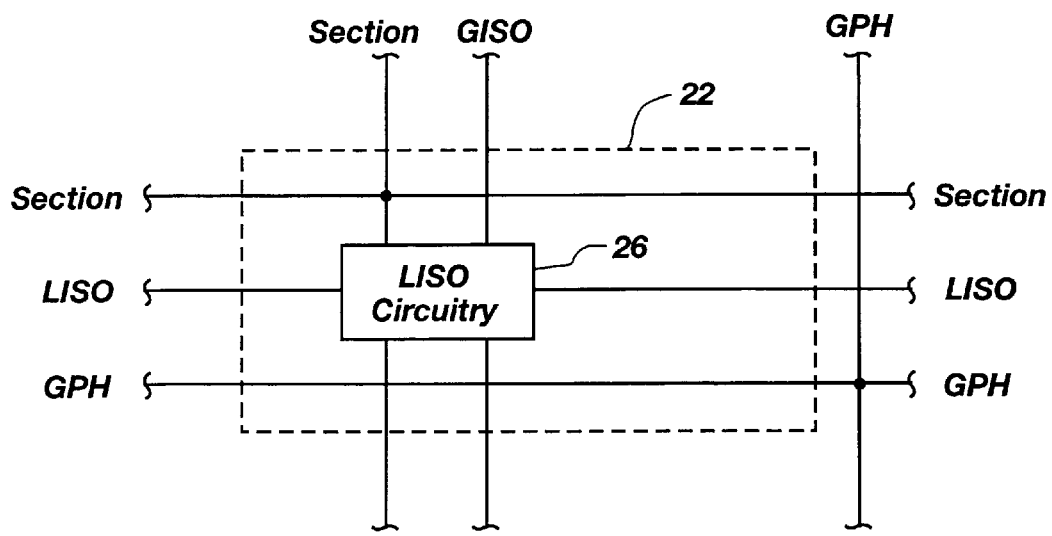
FIG. 2 is a more detailed view of the center circuitry of FIG. 1.
Figure 3:
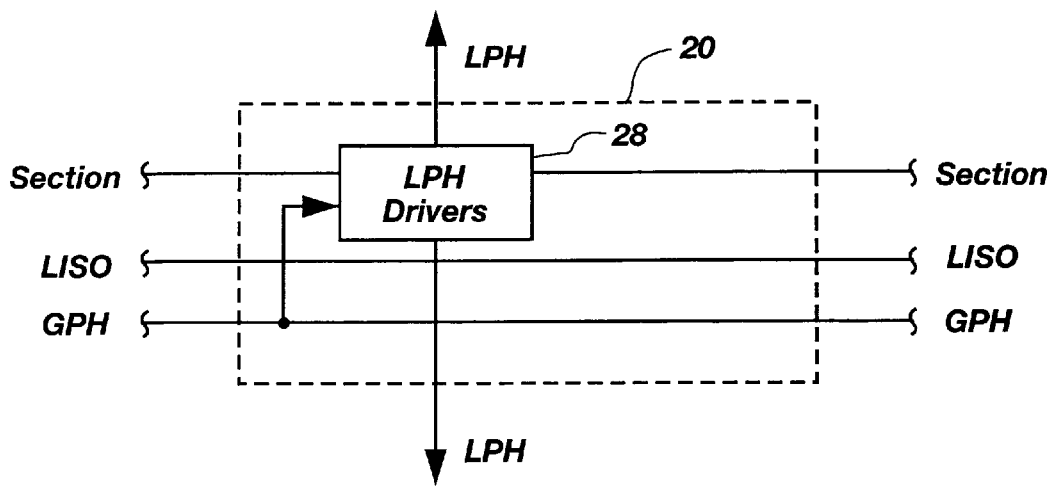
FIG. 3 is a more detailed view of the sense amplifier gap circuitry of FIG. 1.

Because the local phase drivers 58 (FIG. 5) gate the local isolation signals LISO together with the global phase signals GPH to determine which local phase signals LPH are activated, the section signals SECTION do not need to be routed to the gap circuitry 50. Thus, the extensive routing of section signals to gap circuitry and sense amplifiers found in conventional DRAMs (see FIG. 1) is avoided. As a result, this invention allows the DRAM 40 to use less "real estate" on the die on which it is fabricated.

Figure 6:
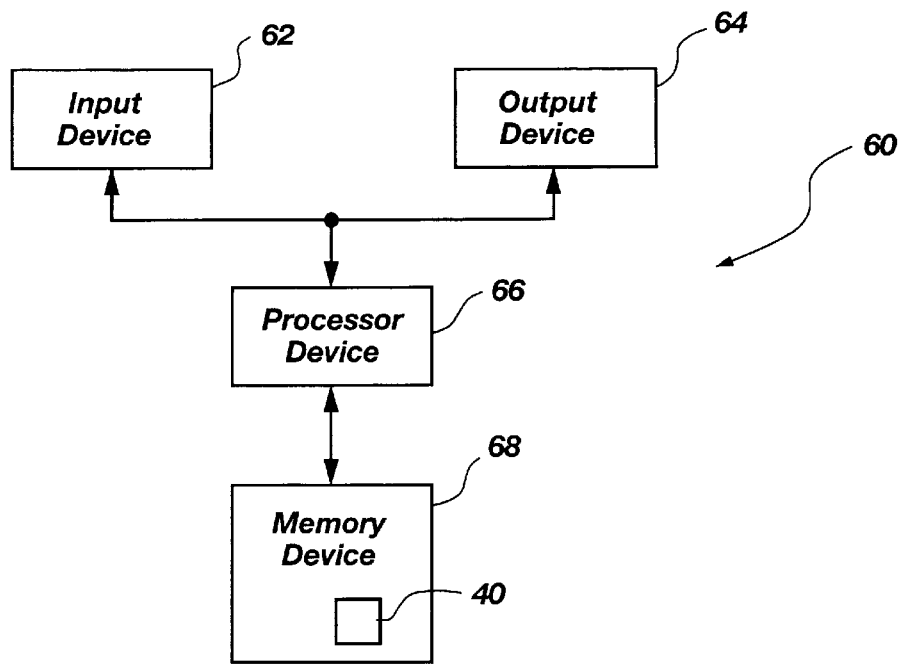
FIG. 6 is a block diagram of an electronic system incorporating the DRAM of FIG. 4.

As shown in FIG. 6, an electronic system 60 includes an input device 62, an output device 64, a processor device 66, and a memory device 68 incorporating the DRAM 40 of FIG. 4. Of course, it will be understood that the DRAM 40 of FIG. 4 may be incorporated into any one of the input, output, and processor devices 62, 64, and 66 too.

Figure 7:
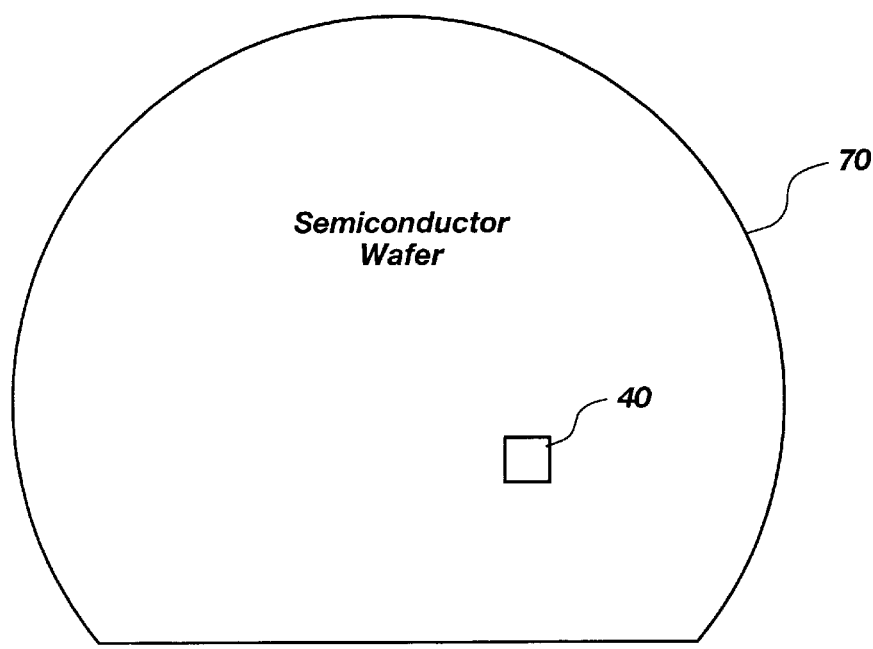
FIG. 7 is a diagram of a semiconductor wafer on which the DRAM of FIG. 4 is fabricated.

As shown in FIG. 7, the DRAM 40 of FIG. 4 is fabricated on the surface of a semiconductor wafer 70 in accordance with this invention. Of course, it should be understood that the DRAM 40 may be fabricated on semiconductor substrates other than a wafer, such as a Silicon-on-Insulator (SOI) substrate, a Silicon-on-Glass (SOG) substrate, and a Silicon-on-Sapphire (SOS) substrate.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A semiconductor memory comprising address circuitry coupled to at least one center circuitry by a section signal line, a global isolation line and a global phase signal line, the at least one center circuitry further coupled to at least one gap circuitry by at least one local isolation signal line and at least one global phase signal line, the at least one gap circuitry detached from the section signal line.

2. A local phase driver of a gap circuit in a semiconductor memory, the local phase driver comprising:

at least one local isolation signal input;

at least one global phase signal input; and at least one local phase signal output, the inputs and at least one output configured to produce, in combination, at least one local phase signal in response to receiving at least one local isolation signal and at least one global phase signal.

3. A method of producing a local phase signal comprising:

receiving at least one local isolation signal and at least one global phase signal at a gap circuitry;

gating the at least one global phase signal with the at least one local isolation signal; and generating at least one local isolation signal in response to gating the at least one global phase signal with the at least one local isolation signal.

4. The method of claim 3 further comprising:

receiving at least one section signal and at least one global isolation signal at a center circuitry;

gating the at least one section signal with the at least one global isolation signal; and generating the at least one local isolation signal in response to gating the at least one section signal with the at least one global isolation signal.

5. The method of claim 4 further comprising:

receiving memory addresses at address circuitry; and generating the at least one section signal, the at least one global isolation signal and the at least one global phase signal in response to receiving memory addresses.

6. The method of claim 3, wherein gating the at least one global phase signal with the at least one local isolation signal comprises using at least one local phase driver to gate the signals.

* * * * *

UNITED STATES PATENT AND TRADEMARK OFFICE
CERTIFICATE OF CORRECTION

PATENT NO.    : 6,104,661
DATED         : August 15, 2000
INVENTOR(S)   : William K. Waller It is certified that error appears in the above-identified patent and that said Letters Patent is hereby corrected as shown below:

Title page,
Item [56], References Cited, U.S. PATENT DOCUMENTS, change "5,898,636" to -- 5,898,638 --

Signed and Sealed this

Tenth Day of September, 2002

*Attest:*

*Attesting Officer*

JAMES E. ROGAN
*Director of the United States Patent and Trademark Office*